(12) United States Patent
Nath et al.

(10) Patent No.: US 12,543,379 B2
(45) Date of Patent: Feb. 3, 2026

(54) INTEGRATED CIRCUIT STRUCTURE IN POROUS SEMICONDUCTOR REGION AND METHOD TO FORM SAME

(71) Applicant: GlobalFoundries U.S. Inc., Malta, NY (US)

(72) Inventors: Anindya Nath, Essex Junction, VT (US); Rajendran Krishnasamy, Essex Junction, VT (US); Robert J. Gauthier, Jr., Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 398 days.

(21) Appl. No.: 18/173,313

(22) Filed: Feb. 23, 2023

(65) Prior Publication Data

US 2024/0290776 A1 Aug. 29, 2024

(51) Int. Cl.
*H10D 89/60* (2025.01)
*H10D 8/80* (2025.01)

(52) U.S. Cl.
CPC ............. *H10D 89/713* (2025.01); *H10D 8/80* (2025.01)

(58) Field of Classification Search
CPC ............................... H10D 89/713; H10D 8/80
USPC ....................................................... 257/107
See application file for complete search history.

(56) References Cited

U.S. PATENT DOCUMENTS

| | | |
|---|---|---|
| 4,393,577 A | 7/1983 | Imai |
| 5,767,561 A | 6/1998 | Frei et al. |
| 6,122,975 A * | 9/2000 | Sridhar ............... G01L 9/0042 73/754 |
| 6,225,673 B1 * | 5/2001 | Pendharkar .......... H10D 62/151 257/500 |
| 6,627,507 B2 | 9/2003 | Yuan |
| 6,770,918 B2 | 8/2004 | Russ et al. |

(Continued)

FOREIGN PATENT DOCUMENTS

| | | |
|---|---|---|
| GB | 2038548 A | 7/1980 |
| JP | 2005005321 A | 1/2005 |

OTHER PUBLICATIONS

Z. Liu, J. Vinson, L. Lou and J. J. Lou, "An Improved Bidirectional SCR Structure for Low-Triggering ESD Protection Applications," in IEEE Electron Device Letters, vol. 29, No. 4, pp. 360-362, Apr. 2008, doi: 10.1109/LED.2008.917111.

(Continued)

*Primary Examiner* — Duy T Nguyen
(74) *Attorney, Agent, or Firm* — Francois Pagette; Hoffman Warnick LLC

(57) ABSTRACT

Embodiments of the disclosure provide a structure including a semiconductor substrate. The semiconductor substrate includes a porous semiconductor region, the porous semiconductor region including a cavity. The cavity includes a semiconductor layer therein. The porous semiconductor further includes a device. The device includes a first well at least partially in the semiconductor layer and a second well at least partially in the semiconductor layer and positioned laterally immediately adjacent the first well. The device further includes a first doped region abutting the first well; and a second doped region abutting the second well, wherein the first well and the second doped region have a first type conductivity and the second well and the first doped region having a second type conductivity that is different from the first type conductivity.

12 Claims, 7 Drawing Sheets

(56) References Cited

U.S. PATENT DOCUMENTS

| | | | |
|---|---|---|---|
| 7,145,187 | B1 | 12/2006 | Vashchenko et al. |
| 9,245,760 | B2 | 1/2016 | Mauder et al. |
| 9,324,849 | B2 | 4/2016 | Chung |
| 9,755,015 | B1* | 9/2017 | Phelps ................. H01L 21/764 |
| 10,192,779 | B1 | 1/2019 | Shank et al. |
| 10,727,327 | B2 | 7/2020 | Mishra et al. |
| 10,755,987 | B2 | 8/2020 | Mason et al. |
| 10,892,362 | B1* | 1/2021 | Toner ................... H10D 62/116 |
| 11,158,535 | B2 | 10/2021 | Shank et al. |
| 2001/0036690 | A1 | 11/2001 | Maeda |
| 2004/0033666 | A1* | 2/2004 | Williams ............ H01L 21/743 438/297 |
| 2004/0124439 | A1 | 7/2004 | Minami et al. |
| 2005/0020088 | A1* | 1/2005 | Trivedi ............ H01L 21/76237 257/E21.549 |
| 2009/0309733 | A1* | 12/2009 | Moran ................. G06K 19/041 340/572.1 |
| 2011/0018060 | A1* | 1/2011 | Botula ................. H10D 86/201 257/E21.546 |
| 2012/0225540 | A1* | 9/2012 | Schulze ............ H01L 21/76202 257/E21.09 |
| 2012/0235304 | A1* | 9/2012 | Huisinga ........... H01L 21/76832 438/618 |
| 2014/0015002 | A1 | 1/2014 | Fonteneau |
| 2014/0127867 | A1 | 5/2014 | Chatty et al. |
| 2018/0175019 | A1 | 6/2018 | Yeh et al. |
| 2020/0176441 | A1 | 6/2020 | Gorbachov et al. |
| 2021/0066118 | A1 | 3/2021 | Abou-Khalil et al. |
| 2021/0111249 | A1 | 4/2021 | Hurwitz et al. |
| 2021/0159012 | A1* | 5/2021 | Colinge ................. H10D 1/20 |
| 2021/0376159 | A1* | 12/2021 | Abou-Khalil ...... H10D 30/0314 |

OTHER PUBLICATIONS

Sanda, Hiroyuki et al.; "Fabrication and Characterization of CMOSFETs on Porous Silicon for Novel Device Layer Transfer"; IEDM Technical Digest; Dec. 5, 2005.

Rack, Martin et al.; "Small- and Large-Signal Performance Up to 175 C of Low-Cost Porous Silicon Substrate for RF Applications"; IEEE Transactions on Electron Devices; Apr. 2, 2018 IEEE; pp. 9; vol. 65, issue 5.

Bomchil, G.; "Porous Silicon: The Material and Its Applications in Silicon-On-Insulator Technologies"; Applied Surface Science 41/42; Elsevier Science Publishers; Jan. 1990; pp. 604-613; vols. 41-42.

Unagami, Takashi et al.; "Structure of Porous Silicon Layer and Heat-Treatment Effect"; J. Electrochem. Soc.: Solid-State Science and Technology; Aug. 1978; pp. 1339-1344.

Peng, C. et al.; "Ion Implantation of Porous Silicon"; Rochester Institute of Technology RIT Scholar Works; Appl. Phys. Letters; vol. 64; No. 10; Jun. 4, 1998; pp. 5.

U.S. Appl. No. 17/942,233, filed Sep. 12, 2022 entitled "Semiconductor Device Structures Isolated by Porous Semiconductor Material"; pp. 16.

Nassiopoulou, A.G., et al.; "Porous Si as a substrate material for RF passive integration"; 2013 14th International Conference on Ultimate Integration on Silion (ULIS); 2013; pp. 89-93; doi:10.1109/ULIS.2013.6523498.

U.S. Appl. No. 17/895,153, filed Aug. 25, 2022 entitled "Semiconductor Controlled Rectifier and Method to Form Same"; pp. 31.

U.S. Appl. No. 17/895,153 Office Action dated Jul. 2, 2025, 14 pages.

U.S. Appl. No. 17/942,233, Office Action dated Sep. 30, 2024, 9 pages.

U.S. Appl. No. 17/942,233, Notice of Allowance dated Jul. 16, 2025, 8 pages.

European Search Report and Written Opinion for corresponding EP Application No. 23185154.4-1211 dated Feb. 8, 2024, 9 pages.

Korean Intellectual Property Office, Notice of Preliminary Rejection issued in Korean Patent Application No. 10-2023-0112557 on Sep. 25, 2024, 16 pages.

Korean Intellectual Property Office, Notice of Allowance issued in Korean Patent Application No. 10-2023-0112557 on Apr. 28, 2025, 10 pages.

Taiwan Intellectual Property Office, Office Action and Search Report issued in Taiwanese Patent Application No. 112130469 on May 15, 2025, 12 pages.

Taiwan Intellectual Property Office, Office Action issued in Taiwanese Patent Application No. 112130469 on Feb. 18, 2025, 12 pages.

Taiwan Intellectual Property Office, Office Action and Search Report issued in Taiwanese Patent Application No. 112130469 on May 27, 2024, 14 pages.

U.S. Appl. No. 17/942,233, Response to Office Action filed Dec. 18, 2024, 8 pages.

U.S. Appl. No. 17/942,233, Amendment After Notice of Allowance filed Jul. 17, 2025, 6 pages.

U.S. Appl. No. 17/895,153, Amendment to Office Action filed Oct. 1, 2025, 11 pages.

Taiwan Intellectual Property Office, Notice of Allowance issued in Taiwanese Patent Application No. 112130469 on Sep. 8, 2025, 4 pages.

U.S. Appl. No. 17/895,153, Notice of Allowance dated Nov. 4, 2025, 11 pages.

\* cited by examiner

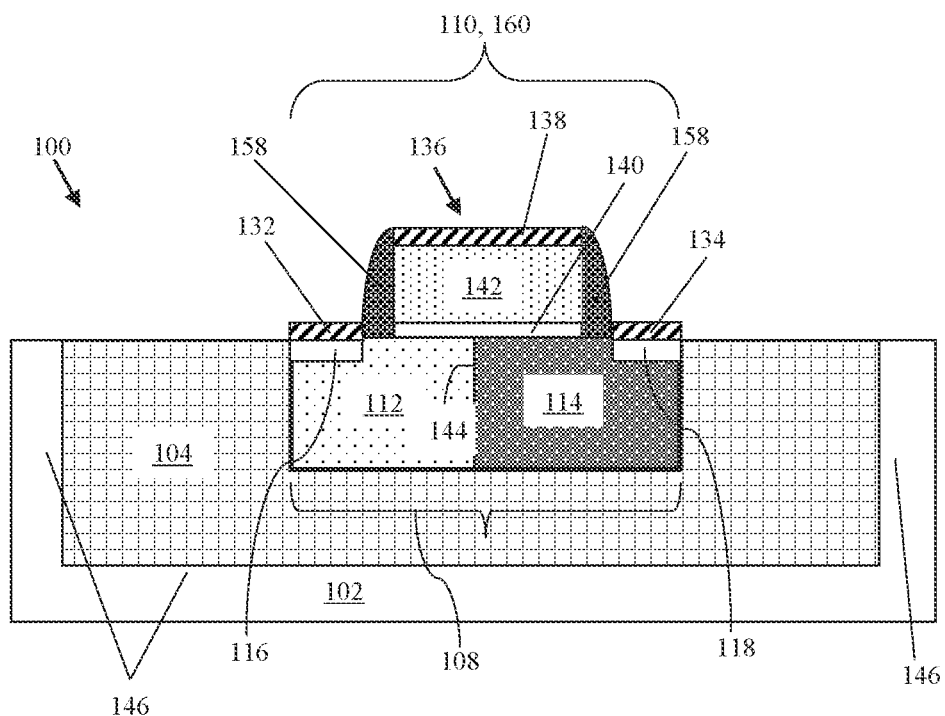
FIG. 1.1
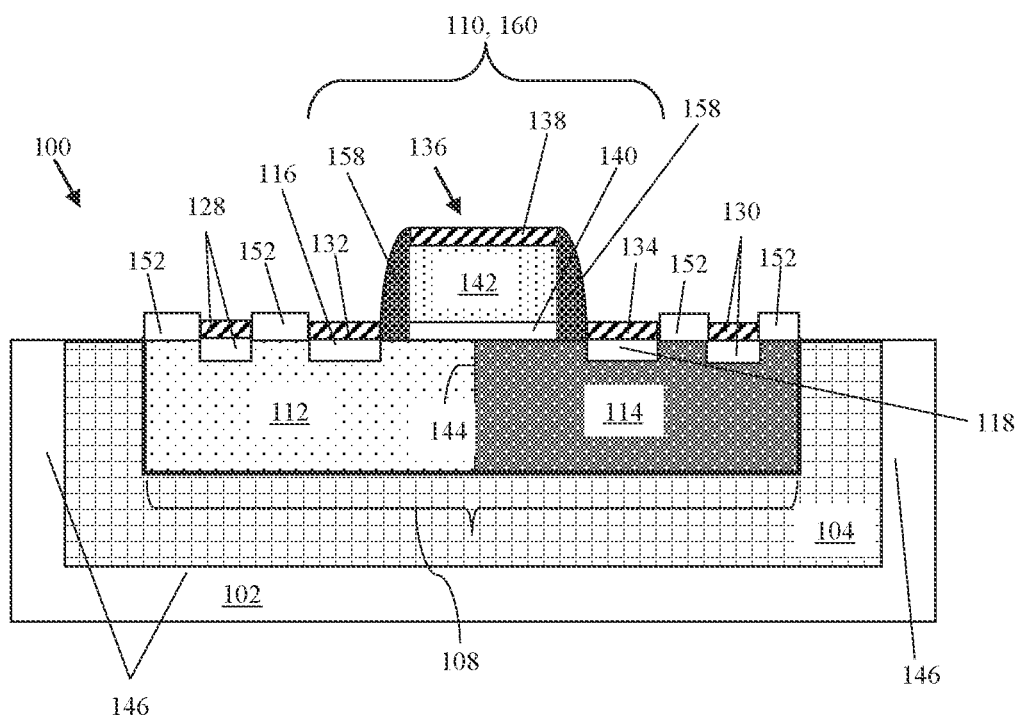
FIG. 1.2

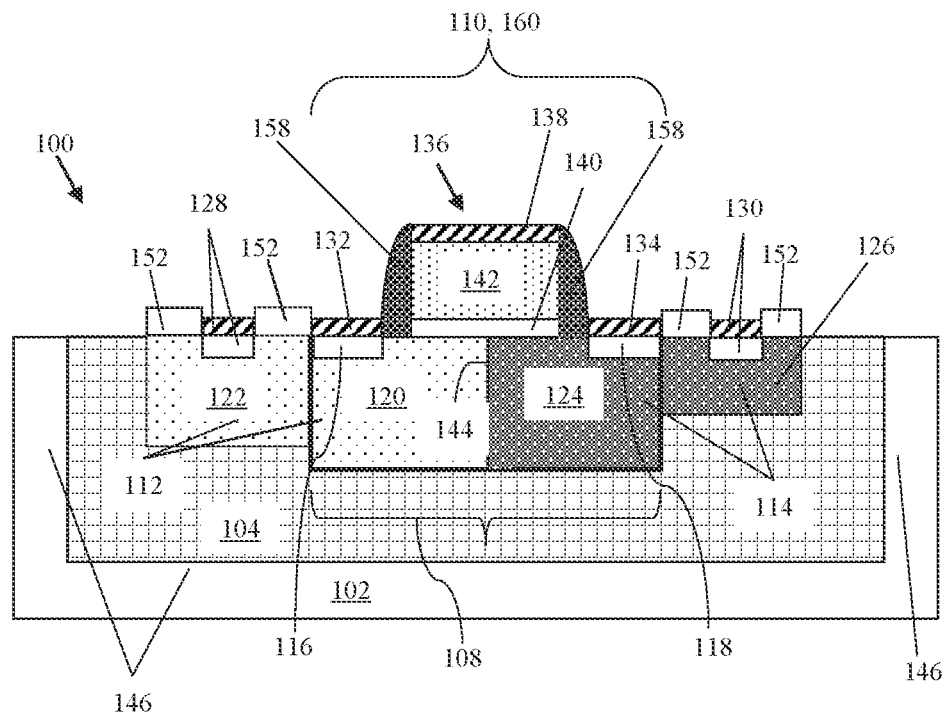
FIG. 1.3
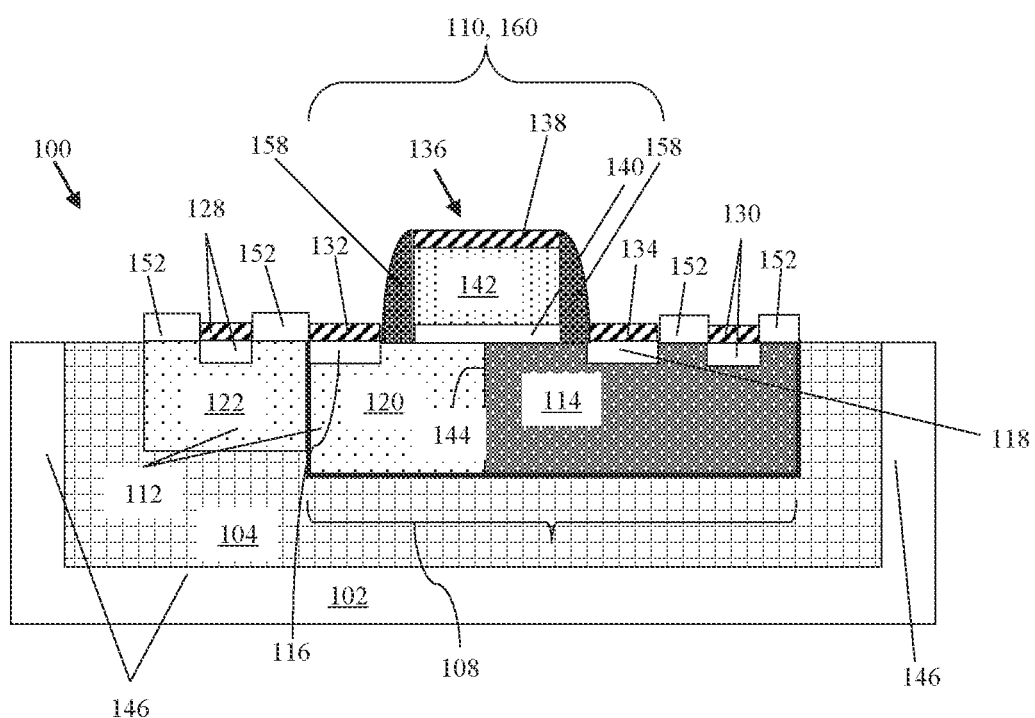
FIG. 1.4

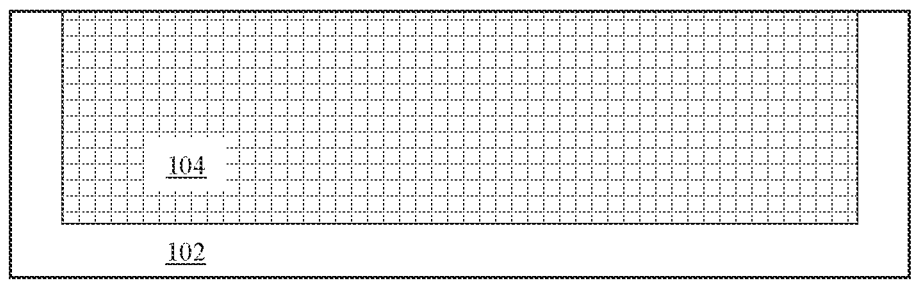
FIG. 2.1
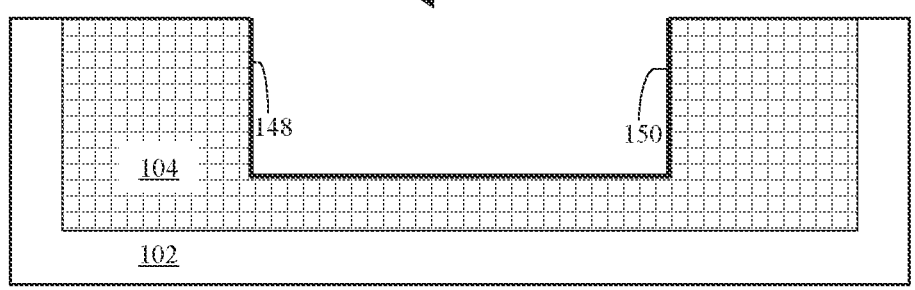
FIG. 2.2

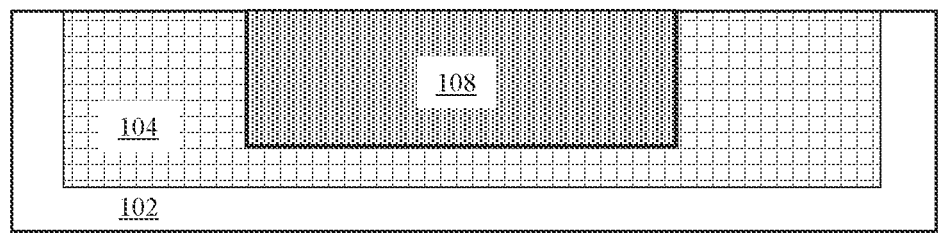
FIG. 2.3
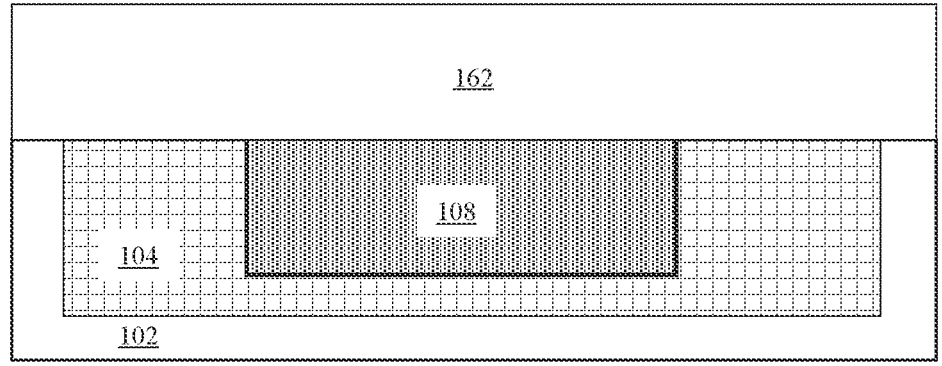
FIG. 2.4

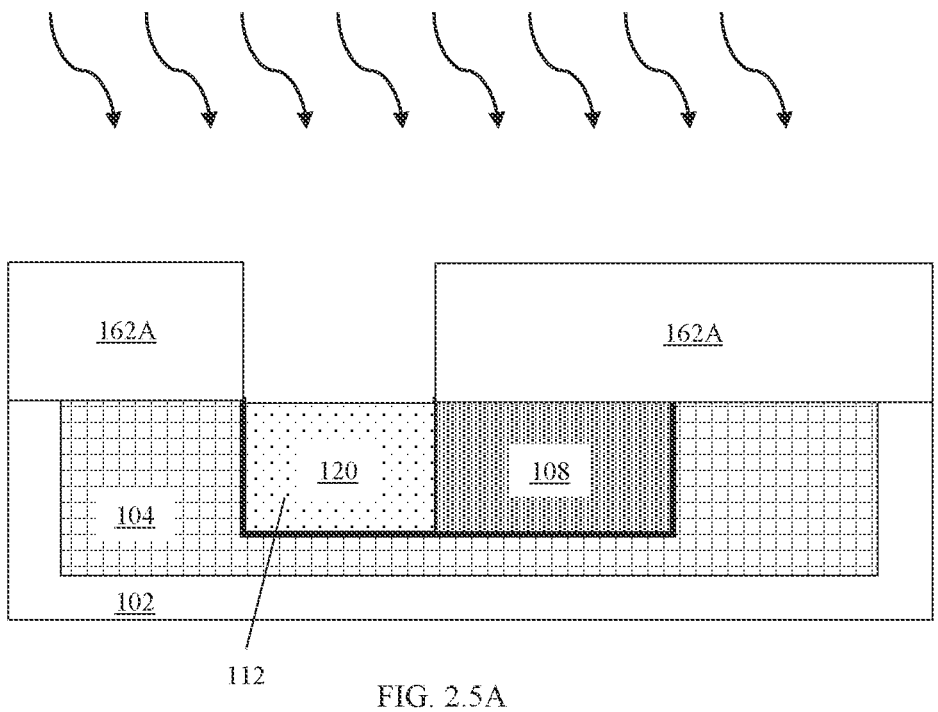
FIG. 2.5A
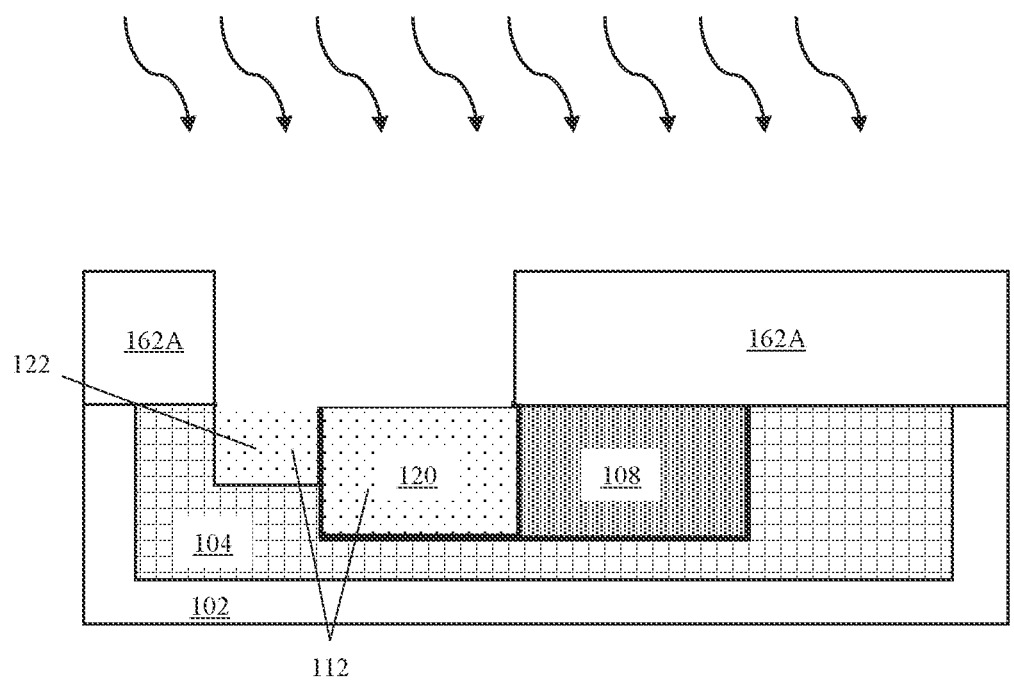
FIG. 2.5B

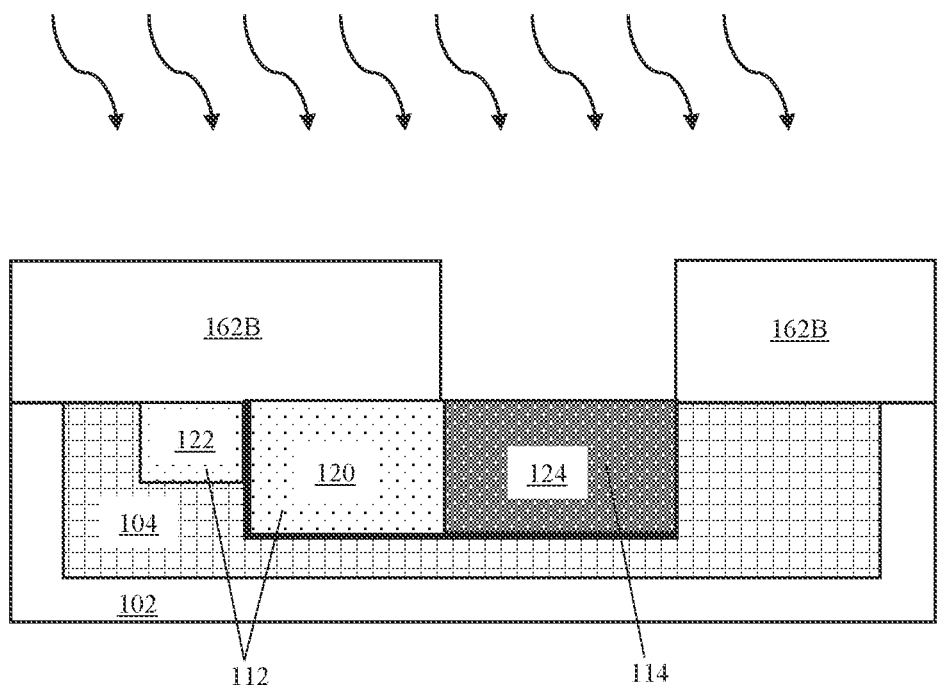
FIG. 2.6A
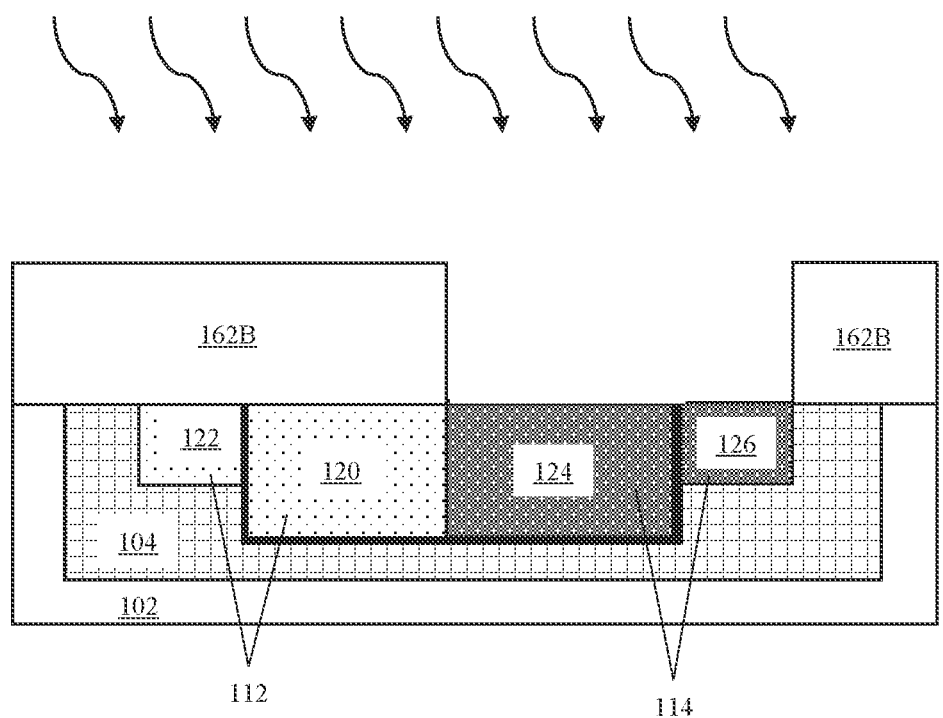
FIG. 2.6B

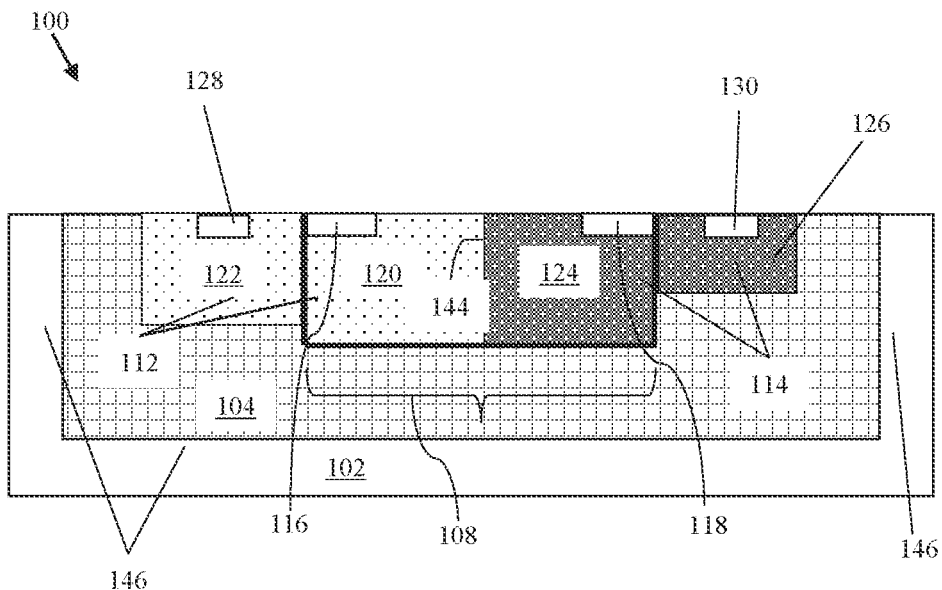
FIG. 2.7
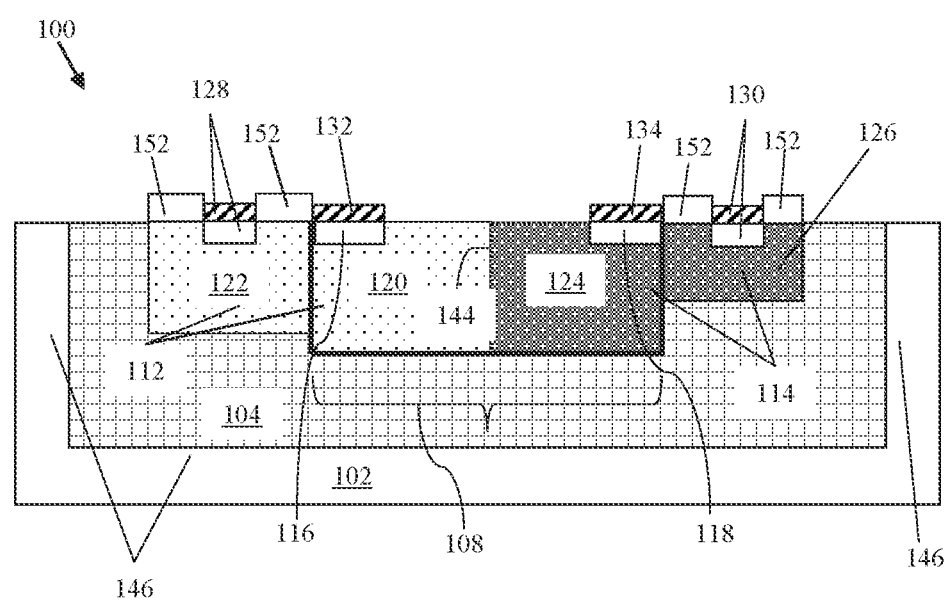
FIG. 2.8

INTEGRATED CIRCUIT STRUCTURE IN POROUS SEMICONDUCTOR REGION AND METHOD TO FORM SAME

BACKGROUND

The present disclosure relates to integrated circuit devices in a porous semiconductor region and related methods to form the same.

Electrostatic discharge (ESD) may cause integrated circuits (ICs) to fail, thereby negatively affecting microchip performance and reliability. IC designs typically include ESD protection devices (e.g., at input/output pads, at power pads, and between power domains). Semiconductor controlled rectifiers (SCRs) (e.g., silicon controlled rectifiers) are one type of device often implemented in microchips to protect other devices from ESD. For example, SRCs are often used to protect antenna ports from ESD in radio frequency (RF) devices. However, SRCs may also degrade RF performance due to their capacitance loading and poor harmonics. For example, ESD devices can suffer performance losses due to undesired parasitic capacitances and bipolar junction transistors established incidental to the fabrication of ESD devices.

SUMMARY

All aspects, examples and features mentioned herein can be combined in any technically possible way.

One aspect of this disclosure includes a structure comprising: a semiconductor substrate including a porous semiconductor region, the porous semiconductor region including a cavity; a semiconductor layer in the cavity; and a device including: a first well at least partially in the semiconductor layer; a second well at least partially in the semiconductor layer and positioned laterally immediately adjacent the first well; a first doped region abutting the first well; and a second doped region abutting the second well, wherein the first well and the second doped region have a first type conductivity and the second well and the first doped region having a second type conductivity that is different from the first type conductivity.

Another aspect of this disclosure includes a structure comprising: a semiconductor layer in a cavity within a porous semiconductor region of a semiconductor substrate; and a device including: a first well with a first proximal portion in the semiconductor layer and a first distal portion in the porous semiconductor region on a first side of the cavity; a second well with a second proximal portion in the semiconductor layer positioned laterally immediately adjacent to the first well and a second distal portion in the porous semiconductor region on a second side of the cavity opposite the first side; a first doped region abutting the first proximal portion of the first well; a first contact region abutting the first distal portion of the first well and physically separated from the first doped region; a second doped region abutting the second proximal portion of the second well; and a second contact region abutting the second distal portion of the second well and physically separated from the second doped region, wherein the first contact region, the first well, and the second doped region have a first type conductivity and the second contact region, the second well and the first doped region having a second type conductivity that is different from the first type conductivity.

Another aspect of this disclosure includes a method comprising: forming a cavity in a porous semiconductor region of a semiconductor substrate; forming a semiconductor layer in the cavity; and forming a device including: a first well at least partially in the semiconductor layer; a second well at least partially in the semiconductor layer and positioned laterally immediately adjacent the first well; a first doped region abutting the first well; and a second doped region abutting the second well, wherein the first well and the second doped region have a first type conductivity and the second well and the first doped region having a second type conductivity that is different from the first type conductivity.

BRIEF DESCRIPTION OF THE DRAWINGS

The present disclosure will be better understood from the following detailed description with reference to the drawings, which are not necessarily drawn to scale and in which:

FIG. 1.1 depicts a cross-sectional view of an integrated circuit (IC) structure including wells in a semiconductor layer in a porous semiconductor region according to embodiments of the disclosure.

FIG. 1.2 depicts a cross-sectional view of an IC structure including wells in a semiconductor layer in a porous semiconductor region according to embodiments of the disclosure.

FIG. 1.3 depicts a cross-sectional view of an IC structure including wells in a semiconductor layer in a porous semiconductor region according to embodiments of the disclosure.

FIG. 1.4 depicts a cross-sectional view of an IC structure including wells in a semiconductor layer in a porous semiconductor region according to embodiments of the disclosure.

FIGS. 2.1 depicts a cross-sectional view of a preliminary IC structure at various processing steps according to embodiments of the disclosure.

FIG. 2.2 depicts a cross-sectional view of a preliminary IC structure during a cavity etch step according to embodiments of the disclosure.

FIG. 2.3 depicts a cross-sectional view of a preliminary IC structure during a semiconductor layer formation step according to embodiments of the disclosure.

FIG. 2.4 depicts a cross-sectional view of a preliminary IC structure during a hard mask formation step according to embodiments of the disclosure.

FIG. 2.5A depicts an alternative cross-sectional view of a preliminary IC structure during a well implantation step according to embodiments of the disclosure.

FIG. 2.5B depicts an alternative cross-sectional view of a preliminary IC structure during a well implantation step according to embodiments of the disclosure.

FIG. 2.6A depicts an alternative cross-sectional view of a preliminary IC structure during a well implantation step according to embodiments of the disclosure.

FIG. 2.6B depicts an alternative cross-sectional view of a preliminary IC structure during a well implantation step according to embodiments of the disclosure.

FIG. 2.7 depicts a cross-sectional view of a preliminary IC structure after forming doped regions and contacts according to embodiments of the disclosure.

FIG. 2.8 depicts a cross-sectional view of a preliminary IC structure after forming an anode, a cathode, and a nitride layer according to embodiments of the disclosure.

DETAILED DESCRIPTION

Electrostatic discharge (ESD) events may negatively impact the reliability of integrated circuits (IC) s. IC designs typically include ESD protection devices (e.g., at input/output pads, at power pads, and between power domains). SCRs (e.g., semiconductor controlled rectifiers) can be employed as ESD devices. In radio frequency (RF) circuits, the presence of SRCs may impede the RF circuitry performance due to capacitive loading and ensuing effects on harmonics.

Embodiments of a structure disclosed herein provide a structure including a semiconductor substrate including a porous semiconductor region, the porous semiconductor region including a cavity; a semiconductor layer in the cavity; and a device including: a first well at least partially in the semiconductor layer; a second well at least partially in the semiconductor layer and positioned laterally immediately adjacent the first well; a first doped region abutting the first well; and a second doped region abutting the second well, wherein the first well and the second doped region have a first type conductivity and the second well and the first doped region having a second type conductivity that is different from the first type conductivity. Among other technical benefits, embodiments of the disclosure reduce parasitic capacitances and inadvertently-formed bipolar junction transistors by including a porous semiconductor region between the device and at least a lower portion of the substrate.

FIGS. 1.1-1.4 show cross-sectional views of a structure 100 according to embodiments of the disclosure. Structure 100 may include a semiconductor substrate 102 ("substrate" hereafter). Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained. Substrate 102 may be doped or may include silicon-on-insulator or fully-depleted semiconductor-on-insulator technology.

Still referring to FIGS. 1.1-1.4, structure 100 may include a porous semiconductor region 104 over or within substrate 102. Porous semiconductor is semiconducting material that underwent subsequent processing to include pores in its microstructure. The pores act as insulative regions, and are regions absent of material or include air or other gaseous materials. The pores may be substantially uniformly distributed or substantially non-uniformly distributed throughout porous semiconductor region 104. By interspersing pores, and therefore insulative regions, throughout porous semiconductor region 104 and forming devices on, near, or within porous semiconductor region 104, parasitic capacitances and undesired bipolar junction transistors ("BJTs") that are typically formed between conductive regions of structure 100 and substrate 102 can be eliminated. For example, in a standard transistor, there may be parasitic capacitances between the channel region and the underlying substrate. As another example, a BJT may be formed between a source region, a well, and the underlying substrate. Parasitic capacitances and BJTs degrade the performance and reliability of ICs. Thus, an advantage of the current disclosure is that at least some parasitic capacitances and BJTs are eliminated by including high-resistivity porous silicon region 104 in structure 100 between the device and at least a lower portion of the substrate. Porous semiconductor may be formed on or within a substrate (e.g., a silicon wafer) by converting a portion of semiconductor material within the substrate into a resistive material porous silicon through, e.g., electrochemical means.

Still referring to FIGS. 1.1-1.4, structure 100 may further include a semiconductor layer 108 (illustrated throughout with thicker lines) in a cavity 106 that extends into the porous semiconductor region 104 (shown in FIG. 2.2). A semiconductor material refers to a material whose conducting properties can be altered by doping with an impurity. Semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

A "dopant" refers to an element introduced into semiconductor to establish either p-type (acceptors) or n-type (donors) conductivity. In the case of a silicon substrate, common dopants may include, e.g., boron (B), and/or indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (e.g., a film of photoresist material and/or other component to block dopants) in place so that only certain areas of the substrate will be doped. In the example of doping by implantation, an ion implanter may be employed. In further examples, in-situ doping or other doping techniques may be used.

In doping processes, a doping type, a dopant species, a dosage, and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$.

In any event, cavity 106 is a trench within porous semiconductor region 104 in substrate 102 formed such that a semiconductor layer 108 may be formed therein. Semiconductor layer 108 may be within cavity 106 and may subsequently be doped to form the constituent subcomponents of device 110. Device 110 may be any IC device capable of being formed with components in and/or on semiconductor layer 108 and is described in further detail below. Semiconductor layer 108 can take on any shape or dimensions, but is illustrated as having a substantially rectangular side profile for simplicity.

Still referring to FIGS. 1.1-1.4, structure 100 may include a device 110. Device 110 is a representative IC device and, as mentioned previously, may include or take the form of any device capable of being formed within semiconductor layer 108. In one embodiment, device 110 may take the form of a semiconductor-controlled rectifier (e.g., a silicon-controlled rectifier (SCR) 160). Those skilled in the art will recognize that a semiconductor-controlled rectifier is a unidirectional solid-state current-controlling device with four-layer p-n-p-n switching. In any case, because device 110 may take the form of a variety of IC devices, it may include one or many CMOS subcomponents, as described herein, such as gates, wells, terminals, etc.

Still referring to FIGS. 1.1-1.4, in one embodiment, semiconductor layer 108 and/or substrate 102 may comprise monocrystalline silicon. In another embodiment, semiconductor layer 108 may be separated from a non-porous semiconductor region 146 of substrate 102 by porous semiconductor region 104. Non-porous semiconductor region 146 may be part of substrate 102 or may be a distinct semiconductor material. Although only a portion of non-porous semiconductor region 146 of substrate 102 is shown, any portion of substrate 102 may separate porous semiconductor region 104 from substrate 102.

Still referring to FIGS. 1.1-1.4, device 110 may include a first well 112 at least partially in semiconductor layer 108 and a second well 114 at least partially in semiconductor layer 108 and positioned laterally immediately adjacent first well 112. Doped portions of structure 100 may be known in the art as a "well." A well commonly refers to the implanted/diffused region in semiconductor wafer needed to implement a complementary metal oxide semiconductor (CMOS) cell. A "deep well" refers to doped semiconductor material located underneath active device components and/or other wells. A "shallow well," similar to a deep well, is an area of doped semiconductor material located beneath active device components but not to the same depth as a deep well. Hence, it is possible for a highly doped active semiconductor material to be located inside of a shallow well or deep well, and/or for the shallow well in turn to be located inside of a deep well. Additional levels of wells may be provided in further device structures, e.g., to produce a "triple well" stack of doped semiconductor materials and/or more complex arrangements of layers having distinct doping polarities and/or types.

First and second wells 112 and 114 may serve as conductive regions of device 110 and, more particularly, SCR 160. First and second wells 112 and 114 may, in some implementations, have substantially aligned bottommost surfaces. However, in other implementations, first and second wells 112 and 114 may include bottommost surfaces substantially misaligned, i.e., one well penetrates further into porous semiconductor region 104. This may be due to differential implantation depths for each dopant type within wells 112 and 114. Regardless of what depth of wells 112 and 114 extend to within porous semiconductor region 104, no parasitic capacitances or BJTs are formed therein because of the high resistivity of porous semiconductor region 104.

For illustration purposes, the first well 112 and the second well 114 are illustrated in FIGS. 1.1-1.4 as extending the full depth of semiconductor layer 108. However, it should be understood that the figures are not intended to be limiting. Alternatively, first well 112 and second well 114 could extend to different depths depending upon the implant energy used. Moreover, while wells 112 and 114 are shown as substantially rectangular for simplicity, one skilled in the art knows that they may be take the form of any shape or dimension.

Still referring to FIGS. 1.1-1.4, device 110 may further include a first doped region 116 abutting first well 112 and a second doped region 118 abutting second well 114. First and second doped regions 116 and 118 may be similar to other doped regions described herein, i.e., they may include impurities that increase conductivity. In various implementations, wells and doped regions may take on a variety of shapes and dimensions within device 110. However, only a few combinations are shown for simplicity.

In some embodiments, first well 112 and second well 114 may be contained entirely in the semiconductor layer 108 (see FIGS. 1.1 and 1.2). Optionally, the structure can further include a first contact region 128 to the first well 112 and a second contact region 130 to the second well 114 (see FIG. 1.2). In other embodiments, shown in FIGS. 1.3 and 1.4, the first well 112 and/or the second well 114 can extend into porous semiconductor region 104. For example, first well 112 has a first proximal portion 120 in semiconductor layer 108 and is positioned laterally immediately adjacent to second well 114. Device 110 may include a first distal portion 122 in porous semiconductor region 104 on a first side 148 (FIG. 2.2) of cavity 106 (and semiconductor layer 108). Further, shown in FIGS. 1.3 and 1.4, first well 112 may be deeper (i.e., deeper within porous semiconductor region 104) in first proximal portion 120 than in the first distal portion 122. First doped region 116 may be in semiconductor layer 108 adjacent to first proximal portion 120 of first well 112, and a first contact region 128 is in porous semiconductor region 104 of the semiconductor substrate 102 adjacent to first distal portion 122 of first well 112. First contact region 128 is a conductive region that electrically couples first doped region 116 to layers thereover and is discussed in further detail below.

In yet another embodiment, shown in FIG. 1.3, second well 114 has a second proximal portion 124 in semiconductor layer 108 positioned laterally immediately adjacent to first well 112 and a second distal portion 126 in porous semiconductor region 104 of substrate 102 on second side 150 (FIG. 2.2 only) of cavity 106 (and semiconductor layer 108). Second well 114 may be deeper within porous semiconductor region 104 in second proximal portion 124 than in second distal portion 126. Second doped region 118 may be in semiconductor layer 108 adjacent to second proximal portion 124. A second contact region 130 is in porous semiconductor region 104 of substrate 102 adjacent to second distal portion 126 of second well 114. Second contact region 128 is a conductive region that electrically couples second doped region 118 to layers thereover and is discussed in further detail below. In yet another embodiment, shown in FIG. 1.4, although first well 112 extends into the porous semiconductor region, the second well 114 is entirely within semiconductor layer 108. Because of differences in lattice geometry between semiconductor layer 108 and porous semiconductor region 104, dopants may penetrate further in regions of semiconductor layer 108 than in porous semiconductor region 104, thereby resulting in different depths within porous semiconductor region 104, as illustrated in FIGS. 1.3 and 1.4.

Referring to FIGS. 1.2-1.4, structure 100 may include first contact region 128 abutting first well 112 and a second contact region 130 abutting second well 114. First contact region 128 may be physically separated from first doped region 116, and may have a first type conductivity. Second contact region 130 may be physically separated from second doped region 118, and may have the second type conductivity. First and second contact regions 128 and 130 may include any currently known or later developed conductive material configured for use in an electrical contact, e.g., tungsten (W). First contact region 128, first well 112, and second doped region 118 may have an N-type conductivity and second contact region 130, second well 114, and first doped region 116 may have a P-type conductivity or vice versa. The first doped region 116, first well 112, second well 114, and second doped region 118 effectively form the four layers for p-n-p-n switching in SCR 160. Furthermore, the first contact region 128 and the second contact region 130 facilitate biasing of the middle two layers (i.e., the first well and the second well) to fine tune the trigger voltage of SCR 160. In a nearby device (not shown), an ESD may follow a current path (not shown) from, e.g., first doped region 116 to first well 112 to second well 114 and second doped region 118.

Referring now to FIGS. 1.1-1.4, structure 100 may include an anode contact 132 on first doped region 116 and a cathode contact 134 on second doped region 118. Anode and cathode contacts 132 and 134 include conductive materials, e.g., tungsten, similar to other conductive features described herein. Anode contact 132 electrically couples first doped region 116 to layers thereover. Similarly, cathode contact 134 electrically couples second doped region 118 to layers thereover. Biasing (i.e., applying a sufficient voltage between) anode contact 132 and cathode contact 134 turns device 110 "on," i.e., device 110 will protect a nearby device (not shown) that is experiencing an ESD event by conducting excess charge. Together, wells 112 and 114, anode 132, and cathode 134 define an alternating set of P-N-P-N doped materials for SCR 160. In some implementations, one of anode 132 or cathode 134 is connected to ground. By connecting one of anode 132 or cathode 134 to ground, device 110 creates a path for an ESD to be dispersed without damaging any nearby devices (not shown) or device 110.

Still referring to FIGS. 1.1-1.4, device 110 may include a number of optional layers or subcomponents. In some implementations, device 110 may optionally include a gate stack 136 on semiconductor layer 108 over a junction 144 between first well 112 and second well 114. Gates in IC devices typically allow a voltage to be applied to a body terminal (region beneath gate). Gates, if present, may be floating or, alternatively, contacted and coupled to voltage sources, e.g., anode, cathode, ground, gate bias voltage, generator, etc. Gate stack 136 may include any now known or later developed gate material. In one non-limiting example, gate stack 136 may include polysilicon. In another non-limiting example, gate stack 136 may include a metal. Gate structure 136 may be horizontally between anode 132 and cathode 134, such that a voltage applied to gate structure 136 will control current flow therebetween. In one embodiment, gate stack 136 is floating, i.e., not biased or electrically connected to anything. Gate stack 136 may include one or more subcomponents for providing a gate terminal for device 110. For example, gate stack 136 may optionally include a conductive layer 138 over gate stack 136. Conductive layer 138 may include, for example, a silicide. As another example, gate stack 136 may include a high dielectric constant (high-K) layer which functions as a gate dielectric layer 140. Gate dielectric layer 140 may include any now known or later developed gate dielectric materials such as but not limited to hafnium silicate (HfSiO), hafnium oxide (HfO2), zirconium silicate (ZrSiOx), zirconium oxide (ZrO2), silicon oxide (SiO2), silicon nitride (Si3N4), silicon oxynitride (SiON), high-k material or any combination of these materials. Gate stack 136 may optionally include a gate 142 which may be polycrystalline or a metal, as described herein. Gate stack 136 may optionally include spacers 158, which may include any now known or later developed spacer material such as silicon nitride. Spacers generally function as protection barriers during fabrication and as electrical insulators during device operation.

In some embodiments, shown in FIGS. 1.2-1.4, device 110 may also include an optional nitride layer 152 over regions between first doped region 116 and first contact region 128. Similarly, device 110 may include optional nitride layer 152 over regions between second doped region 118 and second contact region 130. Optional nitride layer 152 physically protects regions thereunder and electrically separates anode contact 132 from first contact region 128 and cathode contact 134 from second contact region 130.

In one embodiment shown in FIG. 1.4 structure 100 includes semiconductor layer 108 in cavity 106. Both cavity 106 and semiconductor layer 108 are within porous semiconductor region 104 of substrate 102. Structure 100 further includes device 110, device 110 including first well 112 with first proximal portion 120 in semiconductor layer 108 and first distal portion 122 in porous semiconductor region 104 on first side 148 (FIG. 3.2 only) of cavity 106. Device 110 further includes second well 114 including second proximal portion 124 in semiconductor layer 108 positioned laterally immediately adjacent to first well 112 and second distal portion 126 in porous semiconductor region 104 on second side 150 of cavity 106. Second side 150 is opposite first side 148. Structure 100 also includes first doped region 116 abutting first proximal portion 120 of first well 112. First contact region 128 abuts first distal portion 122 of first well 112, first contact region 128 being physically separated from first doped region 116. Second doped region 118 abuts second proximal portion 124 of second well 114. Second contact region 130 abuts second distal portion 126 of second well 114, second contact region 130 being physically separated from second doped region 130. First contact region 128, first well 112, and second doped region 118 each have the first type conductivity while second contact region 130, second well 114, and first doped region 116 each have the second type conductivity, the second type conductivity being different from the first type conductivity.

In another embodiment, first contact region 128, first well 112, and second doped region 118 may have N-type conductivity and second contact region 130, second well 114, and first doped region 116 may have P-type conductivity. In another embodiment, shown in FIG. 1.3, first well 112 is deeper in first proximal portion 120 than in first distal portion 122 and second well 114 is deeper in second proximal portion 124 than in second distal portion 126. An advantage of differential depths is an increased ESD discharge path.

In yet another embodiment, device 110 may further include gate stack 136 on semiconductor layer 108 over junction 144 between first well 112 and second well 114. Gate structure 136 is optional, and is similar to gate structure 136 in other implementations described herein.

FIGS. 2.1-2.8 show cross-sectional views of structure 100 at various stages of fabrication according to implementations. FIG. 2.1 shows porous semiconductor region 104 formed or otherwise manufactured within substrate 102. Porous semiconductor region 104 is formed within substrate 102 by, for example, treating the semiconductor material in substrate 102 through electrochemical, photochemical, or wet etch processes. For example, in some embodiments, a mask layer can be formed on the surface of the semiconductor substrate and patterned with an opening that exposes a portion of the top surface of the semiconductor substrate. An electrochemical process can be performed to convert the semiconductor material in the exposed area of the substrate below the mask opening to a porous semiconductor material by causing the formation of nanopores to be introduced therein. The electrochemical etch process can employ a power source (e.g., a DC voltage supply) with a negative electrode and a positive electrode. A vessel or other containment structure can be configured to hold an etchant (e.g., an etching solution, such as an aqueous hydrofluoric acid (HF) electrolyte solution) such that the exposed area of the substrate at the bottom of the mask opening is covered by and in contact with the etchant. The negative electrode of the power source can be electrically connected to a metallic cathode (e.g., a platinum cathode or other suitable cathode material) in the etchant. The positive electrode of the power source can be electrically connected to the backside of the substrate (i.e., the anode). When the power source is turned on, electrochemical reactions occur at both the cathode and the anode. Specifically, semiconductor (e.g., Si) material at the top surface of the substrates (anode) reacts with water to form an oxide layer (e.g., $SiO_2$). The oxide layer dissolves in the aqueous HF as hexafluorosilicate ($SiF_6$), thereby allowing oxidation to continue resulting in the creation of the nanopores therein. Alternatively, any other suitable process for forming a porous semiconductor region in the semiconductor layer could be employed.

Referring now to FIG. 2.2, forming structure 100 may include forming cavity 106 in porous semiconductor region 104 of substrate 102. Forming cavity 106 may include conventional lithographic patterning and etch techniques or any other form of removing material from porous semiconductor region 104 in structure 100. Although illustrated as substantially rectangular in FIG. 2.2, cavity 106 may be formed of any shape or dimension. In some embodiments, the cavity 106 can be patterned and etched so that it is shallower in depth than and optionally narrower in width than the porous semiconductor region 104, as illustrated in FIG. 2.2.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Referring now to FIG. 2.3, structure 100 includes forming semiconductor layer 108 in cavity 106. Semiconductor layer 108 can be, for example, deposited or grown epitaxially within porous semiconductor region 104. In one embodiment, forming of semiconductor layer 108 includes epitaxially depositing semiconductor layer 108 so semiconductor layer 108 is monocrystalline in structure.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The terms "epitaxy," "epitaxial growth," and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

FIG. 2.4 shows structure 100 after a hard mask 162 if formed thereon. Hard mask 162 is similar to protective barriers discussed in other implements, i.e., it is a film of photoresist material and/or other component to block dopants. The term "mask" may be given to a layer of material which is applied over an underlying layer of material, and patterned to have openings, so that the underlying layer can be processed where there are openings, i.e., hard mask 162 may be selectively etched to expose portions of porous semiconductor region 104 and semiconductor layer 108 for subsequent doping. After processing the underlying layer, the mask may be removed. Common masking materials are photoresist (resist) and nitride. Nitride is usually considered to be a "hard mask." Mask may include a developable organic planarization layer (OPL) on the layer to be etched, a developable anti-reflective coating (ARC) layer on the developable OPL, and a photoresist mask layer on the developable ARC layer. Masks may be removed using any known removal process appropriate for the mask material, e.g., a wet etch for hard nitride mask or an ashing process (oxygen dry strip process) for a soft resist-based mask.

Referring now to FIGS. 2.5A-2.6B, the wavy lines above structure 100 indicate doping processes to form doped regions within structure 100. More specifically, forming structure 100 includes forming device 110 therein which, as mentioned previously, may take the form of a variety of CMOS devices, including SCR 160. As such, forming device 110 includes forming a variety of subcomponents in structure 100, including forming wells 112 and 114, and doped regions 116 and 118. Thus, the wavy lines in FIG. 2.5A-2.6B may indicate any process for doping a semiconductor material, including methods described previously such as, e.g., ion implantation. In FIGS. 2.5A and 2.5B, hard mask is referred as "162A" and, in FIGS. 2.6A and 2.6B, referred to as "162B" to denote that they may be different hard masks, i.e., hard mask 162A may be entirely removed after forming first proximal and first distal portions 120 and 122 and hard mask 162B formed over structure 100 thereafter to subsequently form second proximal and distal portions 124 and 126. Alternatively, second proximal and distal protons 124 and 126 may be formed before first proximal and distal portions 120 and 122. In either case, hard masks 162A or 162B are formed over structure 100 similarly as hard mask 162. The wavy lines cannot penetrate through hard mask 162 and into underlying layers (e.g., porous semiconductor region 104 and semiconductor layer 108). Thus, the only regions doped are those exposed, i.e., where hard mask 162 has been removed (e.g., using conventional lithographic patterning and etch techniques to form openings in the hard mask).

In FIG. 2.5A, forming device 110 may include forming first well 112 at least partially in semiconductor layer 108 and forming second well 114 at least partially in semiconductor layer 108 and positioned laterally immediately adjacent first well 112. Wells 112 and 114 are formed by introducing dopants (i.e., impurities) into semiconductor layer 108 and/or porous semiconductor region 104 through, e.g., ion implantation. First well 112 and, thus, first proximal portion 120, are formed by selectively removing a portion of hard mask 162 that is over a portion of semiconductor layer 108 and subsequently exposing structure 100 through a doping process. Alternatively, as shown in FIG. 2.5B, a portion of porous semiconductor region 104 may be exposed and subsequently doped, thereby forming first distal portion 122. As mentioned previously, because of differences between porous semiconductor region 104 and semiconductor layer 108, dopants may penetrate further (i.e., closer to substrate 102) in first proximal portion 120 than in first distal portion 122.

Referring now to FIGS. 2.6A and 2.6B, second well 114, second proximal portion 124, and second distal portion 126 are formed similarly to first well 112, first proximal portion 120, and first distal portion 122. That is, second well 114 may be formed in an exposed region semiconductor layer 108 and porous semiconductor region 104. As mentioned previously, because of differences between porous semiconductor region 104 and semiconductor layer 108, dopants may penetrate further (i.e., closer to substrate 102) in second proximal portion 124 than in second distal portion 126.

In one embodiment, device 110 may further include forming first well 112 so that first well 112 is one of the following: entirely within semiconductor layer 108 (shown in FIGS. 1.1 and 1.2); and only partially within semiconductor layer 108 so that first well 112 includes first proximal portion 120 in semiconductor layer 108 and first distal portion 122 in porous semiconductor region 104 on first side 148 (FIG. 2.2 only) of cavity 106. In that same embodiment, second well 114 may be formed so that second well 114 is one of the following: entirely within semiconductor layer 108 (shown in FIGS. 1.1, 1.2, and 1.4); and only partially within semiconductor layer 108 so that second well 114 includes second proximal portion 124 in semiconductor layer 108 and second distal portion 126 in porous semiconductor region 104 on second side 150 of cavity 106 opposite first side 148 (FIG. 1.3).

For illustration purposes, the first well 112 and the second well 114 are illustrated in FIGS. 2.1-2.8 as extending the full depth of semiconductor layer 108. However, it should be understood that the figures are not intended to be limiting. Alternatively, first well 112 and second well 114 could extend to different depths depending upon the implant energy used.

Referring now to FIG. 2.7, device 110 further includes forming first doped region 116 abutting first well 112 and second doped region 118 abutting second well 114. Forming first and second doped regions 116 and 118 includes introducing dopants into device 110 through exposed regions of a hard mask (not shown) similar to other implementations described herein. In one embodiment, first well 112 and second doped region 118 are formed having a first type conductivity and second well 114 and first doped region 116 are formed having a second type conductivity that is different from the first type conductivity.

FIG. 2.8 shows device 110 after forming first contact region 128, second contact region 130, and, optionally, optional nitride 152. First and second contact regions 128 and 130 may be formed by forming a hard mask (not shown) over structure 100, selectively etching portions of the hard mask, similar to other implementations described herein, and doping exposed regions of wells 112 and 114 and/or first and second distal portions 122 and 126. Additionally, optional nitride 152 may be formed between conductive regions (e.g., contacts 128 and 130 and anode 132 and cathode 134) to electrically isolate them from one another. In one embodiment, first contact region 128 may be formed abutting first well 112 and such that it is physically separated from first doped region 116. First contact region 128 may further be formed to include the first type conductivity. Second contact region 130 may be further be formed to include the second type conductivity. Second contact region 130 may be formed abutting second well 114 and physically separated from second doped region 118.

FIGS. 1.1-1.4 show completed structure 100 after forming gate stack 136 formed over semiconductor layer 108 and between anode 132 and cathode 134. Forming gate stack 136 may include forming gate dielectric layer 140 over junction 144, forming gate 142, and forming conductive layer 138 over gate 142. Gate spacers 158 may be formed on opposing sides of gate stack 136 to physically protect gate stack 136 and electrically isolate gate stack 136 from nearby conductive regions.

In the description of the structure embodiments above, reference is made to semiconductor features including, but not limited to, substrates, layers, regions, portions, terminals, etc. and to the conductivity types (e.g., P-type or N-type) of those features. Such features are made up of one or more semiconductor materials and a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductor materials (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing P-type or N-type conductivity is referred to in the art as an intrinsic semiconductor (i.e., an undoped semiconductor). A semiconductor material that is doped with an impurity for the purposes of increasing P-type or N-type conductivity is referred to in the art as an extrinsic semiconductor (i.e., a doped semiconductor). Such an extrinsic semiconductor will be P-type (i.e., will have P-type conductivity) or will be N-type (i.e., will have N-type conductivity) and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, different impurities (i.e., different dopants) can be used to achieve the different conductivity types (e.g., P-type conductivity and N-type conductivity) and that dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in each semiconductor region.

The terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
  a semiconductor substrate including a porous semiconductor region, the porous semiconductor region including a cavity;
  a semiconductor layer in the cavity;
  a device including:
    a first well at least partially in the semiconductor layer;
    a second well at least partially in the semiconductor layer and positioned laterally immediately adjacent the first well;
    a first doped region abutting the first well; and
    a second doped region abutting the second well, wherein the first well and the second doped region have a first type conductivity and the second well and the first doped region having a second type conductivity that is different from the first type conductivity;
  a first contact region abutting the first well, physically separated from the first doped region, and having the first type conductivity; and
  a second contact region abutting the second well, physically separated from the second doped region, and having the second type conductivity,
  wherein the first well has a first proximal portion in the semiconductor layer positioned laterally immediately adjacent to the second well and a first distal portion in the porous semiconductor region of the semiconductor substrate on a first side of the cavity,
  wherein the first well is deeper in the first proximal portion than in the first distal portion, wherein the first doped region is in the semiconductor layer adjacent to the first proximal portion of the first well, and wherein the first contact region is in the porous semiconductor region of the semiconductor substrate adjacent to the first distal portion of the first well.

2. The structure of claim 1, wherein the first contact region, the first well, and the second doped region have N-type conductivity and wherein the second contact region, the second well, and the first doped region have P-type conductivity.

3. The structure of claim 1, wherein the second well is entirely within the semiconductor layer.

4. The structure of claim 1, further comprising:
an anode contact on the first doped region; and
a cathode contact on the second doped region.

5. The structure of claim 1, wherein the device further includes a gate on the semiconductor layer over a junction between the first well and the second well.

6. The structure of claim 1, wherein the semiconductor layer is separated from a non-porous semiconductor region of the semiconductor substrate by the porous semiconductor region.

7. The structure of claim 1, wherein the semiconductor layer and the semiconductor substrate are comprised of monocrystalline silicon.

8. A structure comprising:
a semiconductor substrate including a porous semiconductor region, the porous semiconductor region including a cavity;
a semiconductor layer in the cavity;
a device including:
a first well at least partially in the semiconductor layer;
a second well at least partially in the semiconductor layer and positioned laterally immediately adjacent the first well;
a first doped region abutting the first well; and
a second doped region abutting the second well, wherein the first well and the second doped region have a first type conductivity and the second well and the first doped region having a second type conductivity that is different from the first type conductivity;
a first contact region abutting the first well, physically separated from the first doped region, and having the first type conductivity; and
a second contact region abutting the second well, physically separated from the second doped region, and having the second type conductivity,
wherein the second well has a second proximal portion in the semiconductor layer positioned laterally immediately adjacent to the first well and a second distal portion in the porous semiconductor region of the semiconductor substrate on a second side of the cavity,
wherein the second well is deeper in the second proximal portion than in the second distal portion,
wherein the second doped region is in the semiconductor layer adjacent to the second proximal portion, and
wherein the second contact region is in the porous semiconductor region of the semiconductor substrate adjacent to the second distal portion of the second well.

9. A structure comprising:
a semiconductor layer in a cavity within a porous semiconductor region of a semiconductor substrate; and
a device including:
a first well with a first proximal portion in the semiconductor layer and a first distal portion in the porous semiconductor region on a first side of the cavity;
a second well with a second proximal portion in the semiconductor layer positioned laterally immediately adjacent to the first well and a second distal portion in the porous semiconductor region on a second side of the cavity opposite the first side;
a first doped region abutting the first proximal portion of the first well;
a first contact region abutting the first distal portion of the first well and physically separated from the first doped region;
a second doped region abutting the second proximal portion of the second well; and
a second contact region abutting the second distal portion of the second well and physically separated from the second doped region,
wherein the first contact region, the first well, and the second doped region have a first type conductivity and the second contact region, the second well and the first doped region having a second type conductivity that is different from the first type conductivity.

10. The structure of claim 9, wherein the first contact region, the first well, and the second doped region have N-type conductivity and wherein the second contact region, the second well, and the first doped region have P-type conductivity.

11. The structure of claim 9, wherein the first well is deeper in the first proximal portion than in the first distal portion and wherein the second well is deeper in the second proximal portion than in the second distal portion.

12. The structure of claim 9, wherein the device further includes a gate on the semiconductor layer over a junction between the first well and the second well.

* * * * *